US010937451B2

(12) United States Patent
Inubushi et al.

(10) Patent No.: US 10,937,451 B2
(45) Date of Patent: Mar. 2, 2021

(54) MAGNETORESISTIVE EFFECT ELEMENT WITH NONMAGNETIC SPACER LAYER INCLUDING AN ALUMINUM ALLOY

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/817,690

(22) Filed: Mar. 13, 2020

(65) Prior Publication Data

US 2020/0303634 A1    Sep. 24, 2020

(30) Foreign Application Priority Data

Mar. 18, 2019    (JP) .............................. JP2019-049418

(51) Int. Cl.
    *G11B 5/39*    (2006.01)
    *H01L 43/10*   (2006.01)
    (Continued)

(52) U.S. Cl.
    CPC ............ *G11B 5/3906* (2013.01); *G01R 33/09* (2013.01); *G01R 33/093* (2013.01); *G01R 33/12* (2013.01);
    (Continued)

(58) Field of Classification Search
    None
    See application file for complete search history.

(56) References Cited

U.S. PATENT DOCUMENTS

2016/0019917 A1    1/2016 Du et al.
2017/0221507 A1*   8/2017 Furubayashi et al. ......................
                                                    G11B 5/3906
(Continued)

FOREIGN PATENT DOCUMENTS

JP    2012-190914 A    10/2012
JP       6137577 B2     5/2017
JP    2017-103419 A     6/2017

OTHER PUBLICATIONS

Yoshio Miura et al.; "First-principles study of ballistic transport properties in Co2MnSi/X/Co2Si(001) (X=Ag, Au, Al, V, Cr) trilayers;" Physical Review B; vol. 84; 134432-1-134432-6; 2011.
(Continued)

*Primary Examiner* — Craig A. Renner
(74) *Attorney, Agent, or Firm* — Oliff PLC

(57) ABSTRACT

A magnetoresistive effect element according to the present invention includes: a first ferromagnetic layer as a magnetization fixed layer; a second ferromagnetic layer as a magnetization free layer; and a nonmagnetic spacer layer provided between the first ferromagnetic layer and the second ferromagnetic layer. The nonmagnetic spacer layer comprises an Al alloy represented by General Formula (1), and thereby lattice mismatch between the nonmagnetic spacer layer and the first ferromagnetic layer and/or the second ferromagnetic layer is reduced, compared to lattice mismatch when the nonmagnetic spacer layer is formed of Al.

$$Al_\gamma X_{1-\gamma} \quad (1)$$

[wherein, X indicates one element selected from the group consisting of Li, N, Mg, Si, Sc, Cr, Fe, Ni, Cu, Zn, Ga, Ge, Zr, Ru, Pd, Ag, Sn, W, Pt, Au and Th, and γ is 0.5<γ<1.]

9 Claims, 5 Drawing Sheets

(51) Int. Cl.
  *G01R 33/09* (2006.01)
  *H01L 43/02* (2006.01)
  *H01L 43/08* (2006.01)
  *G01R 33/12* (2006.01)
  *H01F 10/32* (2006.01)

(52) U.S. Cl.
  CPC .............. *H01L 43/02* (2013.01); *H01L 43/08* (2013.01); *H01L 43/10* (2013.01); *G11B 2005/3996* (2013.01); *H01F 10/3254* (2013.01)

(56) References Cited

U.S. PATENT DOCUMENTS

2017/0229643 A1     8/2017    Chen et al.
2018/0342668 A1*   11/2018   Inubushi et al. ...... G11B 5/3906

OTHER PUBLICATIONS

Hari S. Goripati et al.; "Bi-quadratic interlayer exchange coupling in Co2MnSi/Ag/Co2MnSi pseudo spin-valve;" Journal of Applied Physics; vol. 110; pp. 123914-1-123914-7; 2011.

T. Furubayashi et al.; "Structure and transport properties of current-perpendicular-to-plane spin valves using Co2FeAl0.5Si0.5 and Co2MnSi Heusler alloy electrodes;" Journal of Applied Physics; vol. 107; pp. 113917-1-113917-7; 2010.

\* cited by examiner (a)

(b)

(c)

MAGNETORESISTIVE EFFECT ELEMENT WITH NONMAGNETIC SPACER LAYER INCLUDING AN ALUMINUM ALLOY

TECHNICAL FIELD

The present disclosure relates to a magnetoresistive effect element.

BACKGROUND

Non-Patent Document 1 discloses the conduction characteristics of the ferromagnetic layer ($Co_2MnSi$) and the nonmagnetic spacer layer (Al) according to the first principle calculation.
Non Patent Literature 1: PHYSICAL REVIEW B84, 134432 (2011)

SUMMARY

In the magnetoresistive effect element described in Non-Patent Document 1, the ferromagnetic layer is formed of a Heusler alloy, and thus lattice mismatch between the ferromagnetic layer and the nonmagnetic metallic substance layer formed of each of Al is large. As described above, in the magnetoresistive effect element in which the lattice mismatch between the ferromagnetic layer and the nonmagnetic metal layer (nonmagnetic spacer layer) in the magnetoresistive layer is large, it is difficult to improve the crystallinity of these layers. It is difficult to sufficiently improve the magnetoresistance effect.

The present invention was made in view of the aforementioned problems, and an object thereof is to provide a magnetoresistive effect element having a large magnetoresistive effect.

A magnetoresistive effect element according to the present invention includes: a first ferromagnetic layer as a magnetization fixed layer; a second ferromagnetic layer as a magnetization free layer; and a nonmagnetic spacer layer provided between the first ferromagnetic layer and the second ferromagnetic layer. The nonmagnetic spacer layer comprises an Al alloy represented by General Formula (1), and thereby lattice mismatch between the nonmagnetic spacer layer, and the first ferromagnetic layer and/or the second ferromagnetic layer is reduced, compared to lattice mismatch when the nonmagnetic spacer layer is formed of Al.

$$Al_\gamma X_{1-\gamma} \tag{1}$$

[wherein, X indicates one element selected from the group consisting of Li, N, Mg, Si, Sc, Cr, Fe, Ni, Cu, Zn, Ga, Ge, Zr, Ru, Pd, Ag, Sn, W, Pt, Au and Th, and γ is 0.5<γ<1.]

According to this magnetoresistive effect element, the nonmagnetic spacer layer comprises the Al alloy represented by General Formula (1) such that the lattice mismatch between the nonmagnetic spacer layer, and the first ferromagnetic layer and/or the second ferromagnetic layer is reduced, compared to when the nonmagnetic spacer layer is formed of Al. Therefore, according to this magnetoresistive effect element, crystallinities of the first ferromagnetic layer and/or the second ferromagnetic layer, and a crystallinity of the nonmagnetic spacer layer are improved, so that a large magnetoresistive effect can be exhibited.

The magnetoresistive effect element according to claim 1, wherein the nonmagnetic spacer layer having at least one of a nonmagnetic metal layer formed of Al, a first nonmagnetic insertion layer provided on a lower surface of the nonmagnetic metal layer, and a second nonmagnetic insertion layer provided on an upper surface of the nonmagnetic metal layer, the first nonmagnetic insertion layer and the second nonmagnetic insertion layer comprising an Al alloy represented by General Formula (1).

According to this magnetoresistive effect element, the nonmagnetic spacer layer comprises at least one of the first nonmagnetic insertion layer and the second nonmagnetic insertion layer that comprises the Al alloy represented by General Formula (1) such that the lattice mismatch between the nonmagnetic spacer layer, and the first ferromagnetic layer and/or the second ferromagnetic layer is reduced, compared to when the entire nonmagnetic spacer layer is formed of Al. Therefore, according to this magnetoresistive effect element, crystallinities of the first ferromagnetic layer and/or the second ferromagnetic layer, and a crystallinity of the nonmagnetic spacer layer are improved, so that a large magnetoresistive effect can be exhibited.

In the magnetoresistive effect element according to the present invention, a crystalline structure of the Al alloy represented by General Formula (1) may have a face-centered cubic lattice structure.

According to this magnetoresistive effect element, since the crystalline structure of the Al alloy has a face-centered cubic lattice structure, the nonmagnetic spacer layer, the first ferromagnetic layer, and the second ferromagnetic layer are stacked with high crystalline properties. Due to the high crystalline properties, the magnetoresistive effect element according to the present invention can exhibit a large magnetoresistive effect.

In the magnetoresistive effect element according to the present invention, γ of General Formula (1) may satisfy 0.75<γ<1.

According to this magnetoresistive effect element, the crystalline structure of Al alloy can stably have a face-centered cubic lattice structure. Since the nonmagnetic spacer layer, the first ferromagnetic layer, and the second ferromagnetic layer are stacked with higher crystalline properties, a larger magnetoresistive effect is exhibited.

In the magnetoresistive effect element according to the present invention, at least one of the first ferromagnetic layer and the second ferromagnetic layer may comprise a Heusler alloy represented by General Formula (2).

$$Co_2L_\alpha M_\beta \tag{2}$$

where L is at least one or more elements of Mn, Fe and Cr, M indicates one or more elements selected from the group consisting of Si, Al, Ga, and Ge, 0.7<α<1.6, and 0.65<β<1.35.

According to this magnetoresistive effect element, since 0.7<α<1.6 and 0.65<β<1.35, the Heusler alloys for the first ferromagnetic layer and the second ferromagnetic layer have lattice constants close to a case in which it has a stoichiometric composition. As a result, lattice mismatch between the first ferromagnetic layer and/or the second ferromagnetic layer and the nonmagnetic spacer layer can be reduced.

In the magnetoresistive effect element according to the present invention, in General Formula (1), X may be one element selected from the group consisting of Zr, Ru, Pd, Ag, Sn, W, Pt, Au, and Th.

According to this magnetoresistive effect element, the elements comprised by the first ferromagnetic layer and the second ferromagnetic layer and the elements comprised by in the nonmagnetic spacer layer belong to neither the same group nor the same period in the periodic table of the elements. Therefore, diffusion of the elements comprised thereby between the first ferromagnetic layer or the second ferromagnetic layer and the nonmagnetic spacer layer is suppressed.

In the magnetoresistive effect element according to the present invention, in General Formula (1), X may be one element selected from the group consisting of W, Pt, Au, and Th.

According to this magnetoresistive effect element, the elements comprised by the first ferromagnetic layer and the second ferromagnetic layer and the elements comprised by in the nonmagnetic spacer layer belong to neither the same group nor the same period in the periodic table of the elements. Therefore, diffusion of the elements comprised thereby between the first ferromagnetic layer or the second ferromagnetic layer and the nonmagnetic spacer layer is suppressed.

In the magnetoresistive effect element according to the present invention, $\alpha+\beta$ of General Formula (2) may satisfy $2<\alpha+\beta<2.6$.

According to this magnetoresistive effect element, half-metal characteristics are easily maintained in the Heusler alloy comprised by the first ferromagnetic layer and the second ferromagnetic layer.

In the magnetoresistive effect element according to the present invention, when a thickness of the first nonmagnetic insertion layer is defined as t1, t1 may satisfy 0.2 nm<t1<10 nm, and when a thickness of the second nonmagnetic insertion layer is defined as t2, t2 may satisfy 0.2 nm<t2<10 nm.

According to this magnetoresistive effect element, when t1<10 nm and/or t2<10 nm, spin scattering in electrons that move from the first ferromagnetic layer to the second ferromagnetic layer is further reduced. Also, when 0.2 nm<t1 and/or 0.2 nm<t2, lattice mismatch between the nonmagnetic spacer layer and the first ferromagnetic layer and/or the second ferromagnetic layer is further reduced. As a result, a magnetoresistive effect is particularly increased.

According to the present invention, a magnetoresistive effect element having a large magnetoresistive effect can be provided.

BRIEF DESCRIPTION OF THE DRAWINGS

FIG. 4 (b) is a diagram illustrating a relationship between $\beta$ and the normalized MR ratio;

FIG. 4 (c) is a diagram illustrating a relationship between $\alpha+\beta$ and the normalized MR ratio;

DETAILED DESCRIPTION

Figure 1:
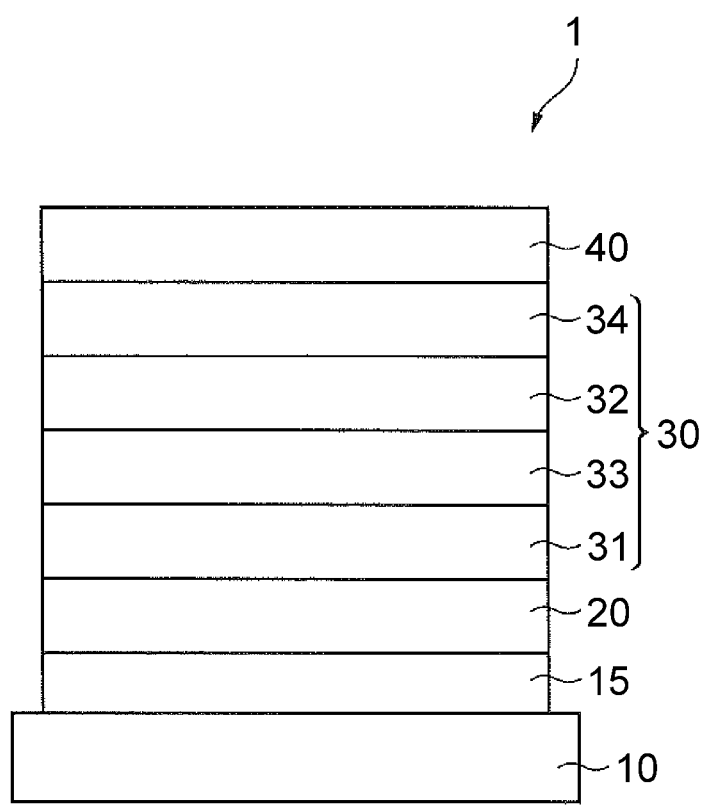
FIG. 1 is a figure which shows a section of the magnetoresistive effect element 1 concerning the embodiment.
Figure 2:
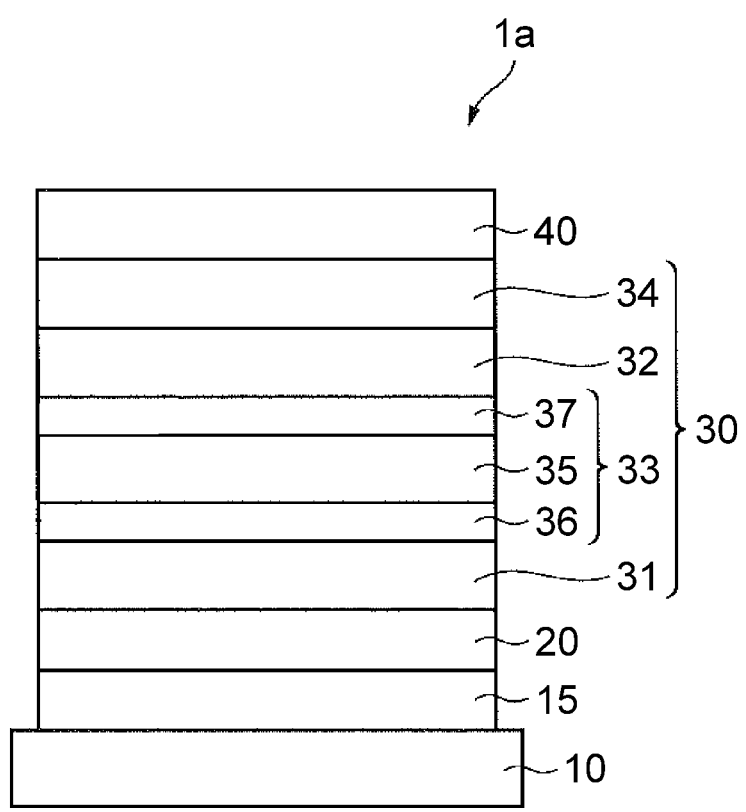
FIG. 2 is a figure which shows a section of the magnetoresistive effect element 1a concerning the embodiment.

As follows, an embodiment of the present disclosure will now be described with reference to the accompanying drawings. Note that, in the drawings, the same component is denoted by the same reference numeral if possible. Also, dimensional ratios in constituent elements and between constituent elements in the drawings are arbitrary, respectively, for ease of viewing of the drawings.

FIG. 1 is a figure which shows a section of magnetoresistive effect element 1 concerning the embodiment. A magnetoresistive effect element 1 includes a substrate 10, a crystal orientation layer 15, a underlayer 20, a magnetoresistive layer 30, and a cap layer 40 in this order. The magnetoresistive layer 30 has a first ferromagnetic layer 31 as a magnetization free layer, a second ferromagnetic layer 32 as a magnetization fixed layer, a nonmagnetic spacer layer 33 provided between the first ferromagnetic layer 31 and the second ferromagnetic layer 32, and an antiferromagnetic layer 34. The second ferromagnetic layer 32 is provided on the nonmagnetic spacer layer 33, and the antiferromagnetic layer 34 is provided on the second ferromagnetic layer 32. The magnetoresistive effect element 1 is fabricated by stacking each of the layers from the crystal orientation layer 15 to the cap layer 40 on the substrate 10 by manufacturing method such as sputtering method or vapor deposition method. The magnetoresistive effect element 1 is a magnetoresistive effect element having a current-perpendicular-to-plane (CPP) structure in which a detection current flows along the stacking direction (the direction perpendicular to the film surface of each layer).

According to this magnetoresistive effect element, the nonmagnetic spacer layer comprises the Al alloy represented by General Formula (1) such that the lattice mismatch between the nonmagnetic spacer layer, and the first ferromagnetic layer and/or the second ferromagnetic layer is reduced, compared to when the nonmagnetic spacer layer is formed of Al. Therefore, according to this magnetoresistive effect element 1, crystallinities of the first ferromagnetic layer 31 and/or the second ferromagnetic layer 32, and a crystallinity of the nonmagnetic spacer layer 33 are improved, so that a large magnetoresistive effect can be exhibited.

Also, the nonmagnetic spacer layer 33 has a nonmagnetic metal layer 35 consisting of Al, a first nonmagnetic insertion layer 36 that is provided on a lower surface of the nonmagnetic metal layer 35, and a second nonmagnetic insertion layer 37 that is provided on an upper surface of the nonmagnetic metal layer 35. Thereby, the nonmagnetic spacer layer 33 comprises at least one of the first nonmagnetic insertion layer 36 and the second nonmagnetic insertion layer 37 that comprises the Al alloy represented by General Formula (1) such that the lattice mismatch between the nonmagnetic spacer layer 33, and the first ferromagnetic layer 31 and/or the second ferromagnetic layer 32 is reduced, compared to when the entire nonmagnetic spacer layer 33 is formed of Al. Therefore, by improving the crystallinity of the first ferromagnetic layer 31 and/or the second ferromagnetic layer 32 and the nonmagnetic spacer layer 33, thereby producing larger magnetoresistive effect.

Examples of the material for the substrate 10 include a single-crystal metal oxide, single-crystal silicon, single-crystal silicon with a thermal oxide film, a single-crystal sapphire, ceramic, quartz, and glass. The material contained in substrate 10 may be any material that has appropriate mechanical strength and is suitable for thermal treatment and micromachining. As the metal oxide single crystal, for example, an MgO single crystal can be exemplified. According to a substrate containing an MgO single crystal, an epitaxial growth film is easily formed. This epitaxial growth film can exhibit large magnetoresistive characteristics.

The underlayer 20 can be an electrode for applying a detecting current, and comprises at least one metal element from, for instance, Ag, Au, Cu, Cr, V, Al, W, and Pt. The underlayer 20 may comprise an alloy of these metal elements or a stacked structure formed of materials composed of two or more of these metal elements. Examples of alloy of metallic elements include cubic AgZn alloys, AgMg alloys, and NiAl alloys.

Also, if needed, the crystal orientation layer 15 for controlling the crystal orientation of the upper layers may be provided between the underlayer 20 and the substrate 10. The crystal orientation layer 15 comprises at least one of, for instance, MgO, TiN, and NiTa alloys. The crystal orientation layer 15 comprises at least one of, for instance, Ag, Au, Cu, Cr, V, Al, W, and Pt.

The nonmagnetic spacer layer 33 comprises an Al alloy expressed by General Formula (1).

$$Al_\gamma X_{1-\gamma} \quad (1)$$

In General Formula (1), X is one element selected from the group consisting of Li, N, Mg, Si, Sc, Cr, Fe, Ni, Cu, Zn, Ga, Ge, Zr, Ru, Pd, Ag, Sn, W, Pt, Au and Th, and $\gamma$ is $0.5<\gamma<1$. A thickness of the nonmagnetic spacer layer 33 is, for instance, no less than 1 nm and no more than 10 nm.

Also, the nonmagnetic spacer layer 33 has a nonmagnetic metal layer 35 consisting of Al, a first nonmagnetic insertion layer 36 that is provided on a lower surface of the nonmagnetic metal layer 35, and a second nonmagnetic insertion layer 37 that is provided on an upper surface of the nonmagnetic metal layer 35. The first nonmagnetic insertion layer 36 and the second nonmagnetic insertion layer 37 comprise an Al alloy expressed by General Formula (1). In General Formula (1), X is one element selected from the group consisting of Li, N, Mg, Si, Sc, Cr, Fe, Ni, Cu, Zn, Ga, Ge, Zr, Ru, Pd, Ag, Sn, W, Pt, Au and Th, and $\gamma$ is $0.5<\gamma<1$. A thickness of the nonmagnetic metal layer 35 is, for instance, no less than 1 nm and no more than 10 nm.

Note that, in the aforementioned magnetoresistive effect element 1 of the present embodiment, when a thickness of the first nonmagnetic insertion layer 36 is defined as t1, 0.2 nm<t1<10 nm, and when a thickness of the second nonmagnetic insertion layer 37 is defined as t2, 0.2 nm<t2<10 nm, for the following reasons. That is, the Al alloy comprised in the first nonmagnetic insertion layer 36 and the second nonmagnetic insertion layer 37 has a shorter spin diffusion length than Al that is a pure metal. Therefore, for this reason, when t1<10 nm and/or t2<10 nm, electrons moving between the first ferromagnetic layer 31 and the second ferromagnetic layer 32 can be sufficiently suppressed from undergoing spin scattering at the first nonmagnetic insertion layer 36 and/or the second nonmagnetic insertion layer 37 during the movement, and thus a magnetoresistive effect is particularly increased. Furthermore, when 0.2 nm<t1 and/or 0.2 nm<t2, the thicknesses of the first and second nonmagnetic insertion layers 36 and 37 are made sufficiently large, and thus the lattice mismatch between the nonmagnetic spacer layer 33 and the first ferromagnetic layer 31 and/or the second ferromagnetic layer 32 can be sufficiently reduced. As a result, the nonmagnetic spacer layer 33 and the first ferromagnetic layer 31 and/or second ferromagnetic layer 32 are stacked with a highly crystalline quality, and thus a magnetoresistive effect is particularly increased.

The first ferromagnetic layer 31 serving as a magnetization free layer is composed of a soft magnetic material and its magnetization direction is substantially not fixed. Therefore, when an external magnetic field is applied to the measurement object, the magnetization direction is easily changed in that direction. The magnetization direction of the second ferromagnetic layer 32 serving as a magnetization fixed layer is harder to change with respect to the external magnetic field than the magnetization direction of the first ferromagnetic layer 31. Preferably, the magnetization direction of the second ferromagnetic layer 32 be substantially fixed with respect to the external magnetic field of a measurement object and do not substantially change with respect to the external magnetic field of the measurement object. When an external magnetic field is applied to the magnetoresistance layer 30 and the relative magnetization directions of the first ferromagnetic layer 31 and the second ferromagnetic layer 32 change, the resistance of the magnetoresistance layer 30 changes and magnetoresistive effect is produced.

The antiferromagnetic layer 34 is provided on a surface of the second ferromagnetic layer 32 which is on the side opposite to the side of the nonmagnetic spacer layer 33. The antiferromagnetic layer 34 is used to substantially fix the magnetization direction of the second ferromagnetic layer 32 by exchange-coupling with the second ferromagnetic layer 32 and imparting unidirectional anisotropy to the second ferromagnetic layer 32. As materials of the antiferromagnetic layer 34, for instance, an FeMn alloy, a PtMn alloy, a PtCrMn alloy, an NiMn alloy, an IrMn alloy, NiO, and Fe2O3 can be exemplified. A thickness of the first ferromagnetic layer 31 ranges from 1 nm to 20 nm, and a thickness of the second ferromagnetic layer 32 ranges from 1 nm to 20 nm. A thickness of the antiferromagnetic layer 34 ranges from 5 nm to 15 nm. In the case where a coercivity of the second ferromagnetic layer 32 is made greater than that of the first ferromagnetic layer 31 and has a magnitude such that the magnetization direction of the second ferromagnetic layer 32 is substantially fixed with respect to the external magnetic field of the measurement target, for example, by a method of changing the thicknesses of the first and second ferromagnetic layers 31 and 32, the antiferromagnetic layer 34 need not necessarily be provided.

In the magnetoresistance layer 30, one of the first ferromagnetic layer 31 and the second ferromagnetic layer 32 is a magnetization free layer, and the other is a magnetization fixed layer: the first ferromagnetic layer 31 may be a magnetization fixed layer, and the second ferromagnetic layer 32 may be a magnetization free layer. In this case, the antiferromagnetic layer 34 is provided on the surface of the first ferromagnetic layer 31 which is on the side opposite to the side of the nonmagnetic spacer layer 33.

At least one of the first and second ferromagnetic layers 31 and 32 can comprise a Heusler alloy expressed by General Formula (2) and is preferably substantially formed of the Heusler alloy.

$$Co_2L_\alpha M_\beta \quad (2)$$

In General Formula (2), L is at least one or more elements of Mn, Fe and Cr, and M is one or more elements selected from the group consisting of Si, Al, Ga, and Ge. Also, $0.7<\alpha<1.6$, and $0.65<\beta<1.35$.

The Heusler alloy expressed by General Formula (2) has a high spin polarizability, and is thus preferred because the magnetoresistive effect element 1 (1a) can then exhibit a large magnetoresistive effect. Since, the conditions of $0.7<\alpha<1.6$ and $0.65<\beta<1.35$ are satisfied, the Heusler alloys for the first and second ferromagnetic layers 31 and 32 have lattice constants close to cases in which they have stoichiometric compositions. For this reason, the following effect that lattice mismatch between the first ferromagnetic layer 31 and/or the second ferromagnetic layer 32 and the nonmagnetic spacer layer 33 is reduced is especially significant.

However, the conditions of $0.7<\alpha<1.6$ and $0.65<\beta<1.35$ in the Heusler alloy may not be satisfied.

A crystalline structure of the Heusler alloy can be an A2 structure, a B2 structure, or a L21 structure. A Heusler alloy with the structure B2, which has higher spin polarizability than the Heusler alloy with the structure A2, is preferable, and a Heusler alloy with the structure L21, which has higher spin polarizability than the Heusler alloy with the structure B2, is more preferable.

Table 1 is a table that gives literature values for spin polarizabilities P of some Heusler alloys in which General Formula (2) is satisfied, Fe and Co. The spin polarizabilities P of the Heusler alloys satisfying General Formula (2) are shown to be greater than 46% for the spin polarizability of Fe and 45% for the spin polarizability of Co.

TABLE 1

| Heusler alloy | P(%) |
|---|---|
| $Co_2Mn(Ge_{0.75}Ga_{0.25})$ | 74 |
| $Co_2Mn(Ga_{0.5}Sn_{0.5})$ | 72 |
| $Co_2Fe(Si_{0.75}Ge_{0.25})$ | 70 |
| $Co_2Fe(Ga_{0.5}Ge_{0.5})$ | 68 |
| $Co_2(Cr_{0.02}Fe_{0.98})Ga$ | 67 |
| $Co_2Mn(GeSn)$ | 67 |
| $Co_2(Mn_{0.9}Fe_{0.05})Sn$ | 65 |
| $(Co, Fe)_2MnGe$ | 65 |
| $Co_2(Mn_{0.5}Fe_{0.5})Ga$ | 65 |
| $Co_2(Cr_{0.02}Fe_{0.98})Si$ | 65 |
| $Co_2Mn(Ti, Sn)$ | 64 |
| $Co_2Mn(Al_{0.5}Sn_{0.5})$ | 63 |
| $Co_2Mn(Ga_xSi_{1-x})$ | 63 |
| $Co_2Fe(Al, Ga)$ | 63 |
| $Co_2Mn(SiGe)$ | 63 |
| $Co_2(Mn_{0.5}Fe_{0.5})Si$ | 61 |
| $Co_2(Cr, Fe)Al$ | 60 |
| $Co_2Mn(Al_{0.5}Si_{0.5})$ | 60 |
| $Co_2Fe(Ga_{0.5}Si_{0.5})$ | 60 |
| $Co_2Fe(Al_{0.5}Si_{0.5})$ | 60 |
| $Co_2MnSi$ | 56 |
| $Co_2MnGe$ | 58 |
| $Co_2MnSn$ | 60 |
| $Co_2MnAl$ | 60 |
| $Co_2MnGa$ | 60 |
| $Co_2CrAl$ | 62 |
| $Co_2FeAl$ | 59 |
| $Co_2FeSi$ | 60 |
| $Co_2FeGa$ | 58 |
| $Co_2CrGa$ | 61 |
| $Co_2TiSn$ | 57 |
| $Co_2VAl$ | 48 |
| Fe | 46 |
| Co | 45 |

The first ferromagnetic layer 31 and the second ferromagnetic layer 32 can comprise a Heusler alloy such as $Co_2MnSn$, $Co_2VAl$, $Co_2MnGa_{0.5}Sn_{0.5}$, $Co_2CrIn$, $Co_2CrSn$ or the like, or a ferromagnetic material such as $Fe_3O_4$, $CrO_2$, CoFeB or the like, or be substantially formed of the ferromagnetic material.

The cap layer 40 is provided to protect the magnetoresistance layer 30. The cap layer 40 may contain, for example, one or more metallic elements selected from the group consisting of Ru, Ag, Al, Cu, Au, Cr, Mo, Pt, W, Ta, Pd and Ir, an alloy of these metallic elements, or a stack body of materials composed of two or more of these metallic elements.

In the manufacturing process of the magnetoresistive effect element 1 (1a), heat treatment is performed as necessary. Also, if needed, a magnetic field applying treatment is performed, and magnetic anisotropy such as uniaxial magnetic anisotropy is imparted to the first ferromagnetic layer 31 and/or the second ferromagnetic layer 32. The magnetic field applying process may be performed together with the heat treatment.

In the magnetoresistive effect element 1 (1a) of the present embodiment as described above, the nonmagnetic spacer layer 33 comprises the Al alloy represented by General Formula (1) and thereby the lattice mismatch between the nonmagnetic spacer layer 33 and the first ferromagnetic layer 31 and/or the second ferromagnetic layer 32 is smaller than lattice mismatch when it is assumed that the nonmagnetic spacer layer 33 is formed of Al. For example, the lattice mismatch between the nonmagnetic spacer layer 33 formed of $Al_yFe_{1-y}$ that satisfies General Formula (1) the first ferromagnetic layer 31 and/or the second ferromagnetic layer 32 is smaller than an assumed lattice mismatch between the nonmagnetic spacer layer 33 assumed to be formed of Al and the first ferromagnetic layer 31 and/or the second ferromagnetic layer 32. Therefore, for this reason, according to the magnetoresistive effect element 1 (1a) of the present embodiment, since crystallinities of the first ferromagnetic layer 31 and/or the second ferromagnetic layer 32 and a crystallinity of the nonmagnetic spacer layer 33 are improved, a large magnetoresistive effect can be exhibited.

Also, in the aforementioned magnetoresistive effect element 1 (1a) of the present embodiment, a crystalline structure of the Al alloy of the nonmagnetic spacer layer 33 may have a face-centered cubic lattice structure (an fcc structure). Therefore, the nonmagnetic spacer layer 33 and the first ferromagnetic layer 31 and the second ferromagnetic layer 32 can be stacked on each other with high crystal quality. This effect is particularly remarkable when the first ferromagnetic layer 31 and the second ferromagnetic layer 32 also have the fcc structure.

In the aforementioned magnetoresistive effect element 1 (1a) of the present embodiment, $\gamma$ in the Al alloy comprised by the nonmagnetic spacer layer 33 may satisfy $0.75<\gamma<1$. Thereby, the crystalline structure of the nonmagnetic spacer layer 33 can stably have a face-centered cubic lattice structure. As a result, since the nonmagnetic spacer layer 33, the first ferromagnetic layer 31, and the second ferromagnetic layer 32 are stacked with higher crystalline properties. This effect is particularly remarkable when the first ferromagnetic layer 31 and the second ferromagnetic layer 32 also have the fcc structure. However, the condition of $0.75<\gamma<1$ may not be satisfied in the Al alloy of the nonmagnetic spacer layer 33.

Also, in the aforementioned magnetoresistive effect element 1 (1a) of the present embodiment, $\gamma$ in the Al alloy comprised by the nonmagnetic spacer layer 33 preferably satisfies $\gamma<0.98$, and more preferably satisfies $\gamma<0.96$. Besides, $\gamma$ preferably satisfies $\gamma\leq0.94$, and more preferably satisfies $\gamma<0.90$. When $\gamma$ in the Al alloy has these values, a proportion of Al comprised by the nonmagnetic spacer layer 33 is reduced. The nonmagnetic spacer layer 33 in which the ratio of Al is reduced can especially reduce the lattice mismatch between the nonmagnetic spacer layer 33 and the first ferromagnetic layer 31 and/or the second ferromagnetic layer 32 compared to the nonmagnetic spacer layer 33 formed of Al.

In the aforementioned magnetoresistive effect element 1(1a) of the present embodiment, X in General Formula (1) may be one selected from the group consisting of Zr, Ru, Pd, Ag, Sn, W, Pt, Au and Th. In this case, the elements comprised by the first and second ferromagnetic layers 31 and 32 and the elements comprised by the nonmagnetic spacer layer 33 belong to neither the same group nor the same period in the periodic table of elements. Therefore, diffusion of the elements comprised by these layers is suppressed between the first ferromagnetic layer 31 and the nonmagnetic spacer layer 33 and between the second ferromagnetic layer 32 and the nonmagnetic spacer layer 33. The suppression of the diffusion increases the magnetoresistive effect.

In the aforementioned magnetoresistive effect element 1 (1a) of the present embodiment, X in General Formula (1) may be one selected from the group consisting of W, Pt, Au and Th. In this case, in the periodic table of elements, a period to which the elements comprised by the first and second ferromagnetic layers 31 and 32 belongs and a period to which the element comprised by the nonmagnetic spacer layer 33 belongs are separated from each other by two or more periods. Therefore, diffusion of the elements comprised in these layers is further suppressed between the first ferromagnetic layer 31 and the nonmagnetic spacer layer 33 and between the second ferromagnetic layer 32 and the nonmagnetic spacer layer 33. The suppression of the diffusion further increases the magnetoresistive effect.

In General Formula (2), the sum of $\alpha$ and $\beta$ may satisfy $2<\alpha+\beta<2.6$. In the Heusler alloy represented by General Formula (2), it has been theoretically shown that the spin polarizability is reduced when Co is substituted with an L or M site, and that an influence on the spin polarizability is small when the element of the L or M site is substituted with a Co site. Therefore, when $2<\alpha+\beta$, Co is suppressed from being substituted with the L or M site, and thus a reduction in spin polarizability caused by element substitution is suppressed. On the other hand, when $2.6\leq\alpha+\beta$, an amount of magnetization of the Heusler alloy is reduced. Therefore, when the condition of $2<\alpha+\beta<2.6$ is satisfied in the Heusler alloy, half-metal characteristics are easily maintained, so that a larger magnetoresistive effect can be obtained. However, the condition of $2<\alpha+\beta<2.6$ may not be satisfied in the Heusler alloy.

Tables 2 to 4 are tables showing examples of the lattice mismatch of the magnetoresistive effect elements. Specifically, Table 2 is a table that shows examples (1 to 22 examples) of the materials of which the first nonmagnetic insertion layer 36 and/or the second nonmagnetic insertion layer 37 of the present embodiment can be formed and Al (23 example), and literature data of the lattice constants when these materials have an fcc structure. Table 3 is a table that shows examples (alloys A to I) of the materials of which the first and second ferromagnetic layers 31 and 32 of the present embodiment can be formed, and literature data of the lattice constants of these materials.

Table 4 is a table that shows lattice mismatch rates of alloy A to I shown in Table 3 with respect to the first to twenty-third example shown in Table 2. The lattice mismatch rates in Table 4 are represented by a percentage, and are obtained by Formula (3) or formula (4) below. A lattice mismatch rates between a [110] direction of a (001) plane of each of the first to twenty-third examples and a [100] direction of a (001) plane of each of the alloys A to I are calculated by Formula (3). A lattice mismatch rates between a [100] direction of a (001) plane of each of the first to twenty-third examples and a [100] direction of a (001) plane of each of the alloys A to I are calculated by Formula (4). Also, In Formula (3) and (4), a indicates the lattice constants of the first to twenty-third examples shown in Table 2, and b indicates the lattice constants of the alloys A to I shown in Table 3. Also, The term "1l2" designates the square root of 2.

Lattice mismatch rate $(\%) = ((a\times\sqrt{2}-b)/b)\times100(\%)$ (3)

Lattice mismatch rate $(\%) = ((a-b)/b)\times100(\%)$ (4)

TABLE 2

| | Nonmagnetic spacer layer | Lattice constant(nm) |
|---|---|---|
| First example | $Al_{0.9}Li_{0.1}$ | 0.4046 |
| Second example | $Ag_{0.5}N_{0.5}$ | 0.3956 |
| Third example | $Al_{0.95}Mg_{0.05}$ | 0.4082 |
| Fourth example | $Al_{0.988}Si_{0.012}$ | 0.4047 |
| Fifth example | $Al_{0.97}Sc_{0.03}$ | 0.4065 |
| Sixth example | $Al_{0.98}Cr_{0.02}$ | 0.4008 |
| Seventh example | $Al_{0.9}Fe_{0.1}$ | 0.404 |
| Eighth example | $Al_{0.923}Ni_{0.077}$ | 0.4025 |
| Ninth example | $Al_{0.99}Cu_{0.01}$ | 0.4038 |
| Tenth example | $Al_{0.95}Zn_{0.05}$ | 0.4012 |
| Eleventh example | $Al_{0.95}Ga_{0.05}$ | 0.4055 |
| Twelfth example | $Al_{0.85}Ge_{0.15}$ | 0.4064 |
| Thirteenth example | $Al_{0.978}Zr_{0.022}$ | 0.4051 |
| Fourteenth example | $Al_{0.9}Ru_{0.1}$ | 0.402 |
| Fifteenth example | $Al_{0.67}Pd_{0.33}$ | 0.58 |
| Sixteenth example | $Al_{0.95}Ag_{0.05}$ | 0.4052 |
| Seventeenth example | $Al_{0.977}Sn_{0.023}$ | 0.4041 |
| Eighteenth example | $Al_{0.99}W_{0.01}$ | 0.4038 |
| Nineteenth example | $Al_{0.981}Pt_{0.02}$ | 0.4044 |
| Twentieth example | $Al_{0.67}Pt_{0.33}$ | 0.591 |
| Twenty-first example | $Al_{0.67}Au_{0.33}$ | 0.5999 |
| Twenty-second example | $Al_{0.9977}Th_{0.0023}$ | 0.4049 |
| Twenty-third example | Al | 0.4049 |

TABLE 3

| | Type of Hensler alloy | Lattice constant(nm) |
|---|---|---|
| Alloy A | $Co_2MnSi$ | 0.5606 |
| Alloy B | $Co_2MnGe$ | 0.5711 |
| Alloy C | $Co_2MnGa$ | 0.577 |
| Alloy D | $Co_2FeGa$ | 0.5677 |
| Alloy E | $Co_2FeSi$ | 0.5658 |
| Alloy F | $Co_2MnAl$ | 0.5664 |
| Alloy G | $Co_2FeAl$ | 0.573 |
| Alloy H | $Co_2CrAl$ | 0.589 |
| Alloy I | $Co_2FeGe_{0.5}Ga_{0.5}$ | 0.574 |

TABLE 4

| | LMR[*] of alloy A(%) | LMR of alloy B(%) | LMR of alloy C(%) | LMR of alloy D(%) | LMR of alloy E(%) | LMR of alloy F(%) | LMR of alloy G(%) | LMR of alloy H(%) | LMR of alloy I(%) | Evaluation |
|---|---|---|---|---|---|---|---|---|---|---|
| 1st Example | 2.07 | 0.19 | −0.84 | 0.79 | 1.13 | 1.02 | −0.14 | −2.86 | −0.32 | A |
| 2nd Example | −0.2 | −2.04 | −3.04 | −1.45 | −1.12 | −1.22 | −2.36 | −5.01 | −2.53 | B |
| 3rd Example | 2.97 | 1.08 | 0.05 | 1.69 | 2.03 | 1.92 | 0.74 | −1.99 | 0.57 | B |
| 4th Example | 2.09 | 0.22 | −0.81 | 0.82 | 1.15 | 1.05 | −0.12 | −2.83 | −0.29 | A |
| 5th Example | 2.55 | 0.67 | −0.36 | 1.27 | 1.61 | 1.5 | 0.34 | −2.39 | 0.16 | A |
| 6th Example | 1.11 | −0.75 | −1.76 | −0.16 | 0.18 | 0.07 | −1.08 | −3.77 | −1.25 | A |

TABLE 4-continued

|  | LMR* of alloy A(%) | LMR of alloy B(%) | LMR of alloy C(%) | LMR of alloy D(%) | LMR of alloy E(%) | LMR of alloy F(%) | LMR of alloy G(%) | LMR of alloy H(%) | LMR of alloy I(%) | Evaluation |
|---|---|---|---|---|---|---|---|---|---|---|
| 7th Example | 1.92 | 0.04 | −0.98 | 0.64 | 0.98 | 0.87 | −0.29 | −3 | −0.46 | A |
| 8th Example | 1.54 | −0.33 | −1.35 | 0.27 | 0.6 | 0.5 | −0.66 | −3.36 | −0.83 | A |
| 9th Example | 1.87 | 0 | −1.03 | 0.59 | 0.93 | 0.83 | −0.34 | −3.04 | −0.51 | A |
| 10th Example | 1.21 | −0.65 | −1.67 | −0.06 | 0.28 | 0.17 | −0.98 | −3.67 | −1.15 | A |
| 11th Example | 2.29 | 0.41 | −0.61 | 1.02 | 1.35 | 1.25 | 0.08 | −2.64 | −0.09 | A |
| 12th Example | 2.52 | 0.64 | −0.39 | 1.24 | 1.58 | 1.47 | 0.3 | −2.42 | 0.13 | A |
| 13th Example | 2.19 | 0.31 | −0.72 | 0.91 | 1.25 | 1.14 | −0.02 | −2.74 | −0.2 | A |
| 14th Example | 1.41 | −0.45 | −1.47 | 0.14 | 0.48 | 0.37 | −0.78 | −3.48 | −0.96 | A |
| 15th Example | 3.46 | 1.56 | 0.52 | 2.17 | 2.51 | 2.4 | 1.22 | −1.53 | 1.05 | B |
| 16th Example | 2.23 | 0.35 | −0.68 | 0.95 | 1.29 | 1.18 | 0.02 | −2.7 | −0.16 | A |
| 17th Example | 1.94 | 0.07 | −0.96 | 0.67 | 1 | 0.9 | −0.26 | −2.97 | −0.44 | A |
| 18th Example | 1.87 | −0.01 | −1.03 | 0.59 | 0.93 | 0.82 | −0.34 | −3.05 | −0.51 | A |
| 19th Example | 2.02 | 0.14 | −0.88 | 0.74 | 1.08 | 0.97 | −0.19 | −2.9 | −0.36 | A |
| 20th Example | 5.42 | 3.48 | 2.43 | 4.1 | 4.45 | 4.34 | 3.14 | 0.34 | 2.96 | B |
| 21st Example | 7.01 | 5.04 | 3.97 | 5.67 | 6.02 | 5.91 | 4.69 | 1.85 | 4.51 | B |
| 22nd Example | 2.15 | 0.27 | −0.75 | 0.87 | 1.21 | 1.1 | −0.06 | −2.77 | −0.23 | A |
| 23rd Example | 2.15 | 0.28 | −0.75 | 0.88 | 1.21 | 1.11 | −0.06 | −2.77 | −0.23 | — |

*LMR is a lattice mismatch rate.

Results of evaluating the first to twenty-second example are also shown in Table 4. Among the first to twenty-second examples, those having smaller lattice mismatch rates than the twenty-third example case with respect to 3 or more of alloy A to I were evaluated as "A" that represents "particularly good" in Table 4. Also, Among the first to twenty-second examples, those having smaller lattice mismatch rates than the twenty-third example case with respect to 1 to 2 of the alloys A to I were evaluated as "B" that represents "goodness" in Table 4.

As shown in Table 4, it is estimated as "A" or "B" in the example (the first to twenty-second examples) when γ of the Al alloy ($Al_\gamma X_{1-\gamma}$) is 0.5<γ<1, and, in the examples (the first, fourth to fourteenth, sixteenth to nineteenth, twenty-second example cases) when γ is 0.75<γ<1, it is evaluated with "A". If the materials of the examples of the evaluation B are used as the the first nonmagnetic insertion layer 36 and/or the second nonmagnetic insertion layer 37 of the present embodiment, it is thought that crystallinities of the first ferromagnetic layer 31 and/or second ferromagnetic layer 32 and the nonmagnetic spacer layer 33 are improved, and that a large magnetoresistive effect is exhibited. If the materials of the examples of the evaluation A are used as the first nonmagnetic insertion layer 36 and/or the second nonmagnetic insertion layer 37 of the present embodiment, it is thought that the crystallinities are further improved, and that a larger magnetoresistive effect is exhibited.

EXAMPLE

As follows, a magnetoresistive effect element will now be further described with examples and comparative examples of the present disclosure, but the present disclosure should not be limited to the examples below.

Table 5 is a table that collectively shows an Al alloy for the nonmagnetic spacer layer, a Heusler alloy ($Co_2L_\alpha M_\beta$) for the first ferromagnetic layer and the second ferromagnetic layer, values of α, β, and α+β, and a normalized MR ratio in the magnetoresistive effect element according to Examples 1 to 26 and Comparative Example 1 prepared as described below.

Table 6 is a table that collectively shows an Al alloy for the first nonmagnetic insertion layer and the second nonmagnetic insertion layer, thicknesses of the first nonmagnetic insertion layer and the second nonmagnetic insertion layer, a Heusler alloy ($Co_2L_\alpha M_\beta$) for the first ferromagnetic layer and the second ferromagnetic layer, values of α, β, and α+β, and a normalized MR ratio in the magnetoresistive effect element according to Examples 27 to 36 and Comparative Example 1 prepared as described below.

A magnetoresistive ratio (an MR ratio) in the magnetoresistive effect element is estimated from a magnitude of measured magnetoresistive. The MR ratio is represented by a percentage, and is obtained by Formula (5) below.

$$\text{MR ratio }(\%)=((R_{AP}-R_P)/R_P)\times 100(\%) \quad (5)$$

In this Formula (5), $R_{AP}$ is the magnitude of the resistance of the magnetoresistive effect element in the state where the direction of the magnetization of the first ferromagnetic layer and the direction of the magnetization of the second ferromagnetic layer are antiparallel to each other. Also, $R_P$ is the magnitude of the resistance of the magnetoresistive effect element in the state where the direction of the magnetization of the first ferromagnetic layer and the direction of the magnetization of the second ferromagnetic layer are parallel to each other.

In Table 5 and 6, normalized MR ratios of Examples and Comparative Example 1, which are obtained from MR ratios of Examples and Comparative Example 1 measured according to the aforementioned definition, are shown. The normalized MR ratio refers to a value calculated by dividing the MR ratio in Examples and Comparative Example 1 by the MR ratio in Comparative Example 1.

Figure 3:
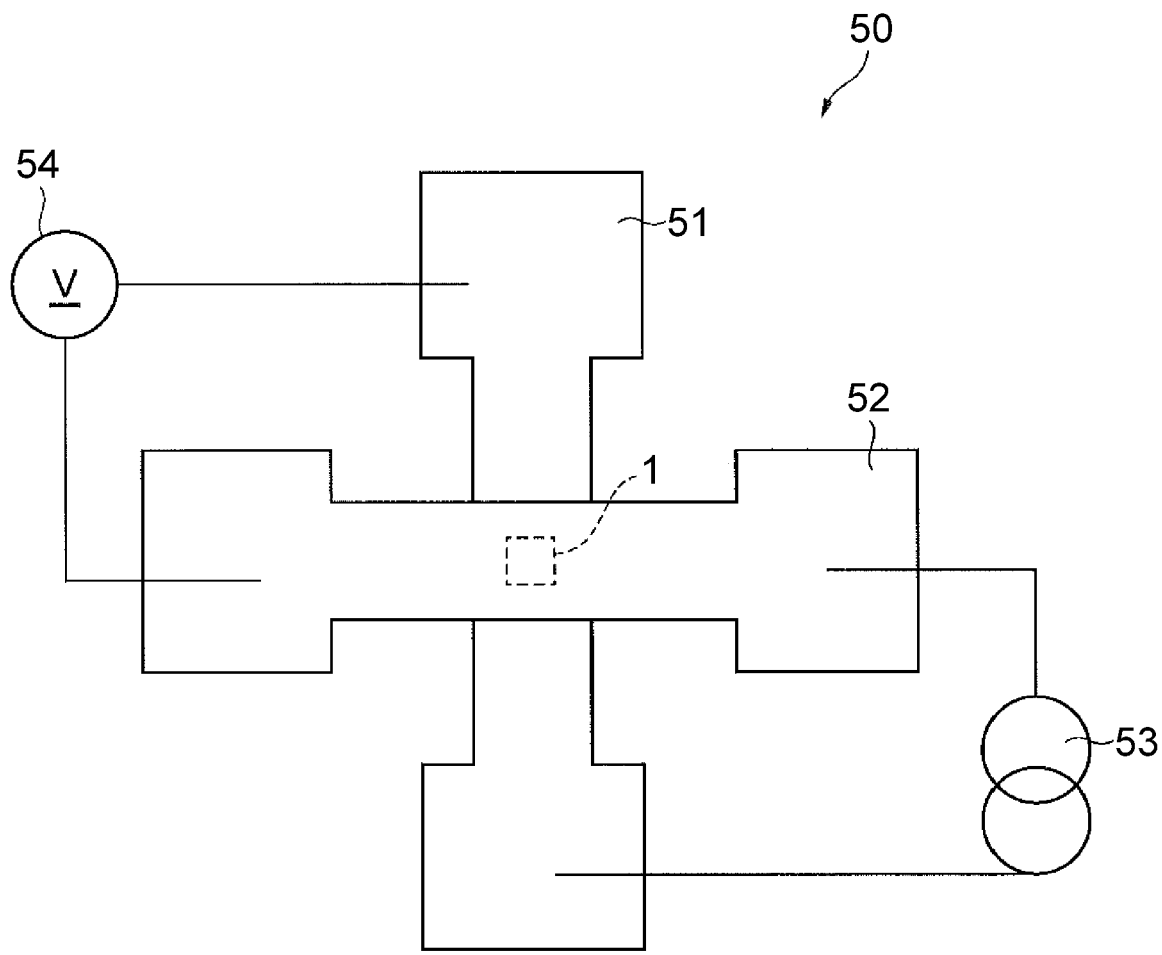
FIG. 3 is a figure which shows the magnetoresistive effect element device according to an example.

FIG. 3 is a diagram showing a magnetoresistance device capable of evaluating the MR ratio of the magnetoresistive effect element. A magnetoresistance device 50 includes a first electrode layer 51 and a second electrode layer 52 between which a magnetoresistive effect element 1 (1a) is sandwiched. The magnetoresistive effect element 1 (1a) is fine-patterned into a shape suitable for measurement of magnetoresistive characteristics. The first electrode layer 51 is connected to the underlayer 20 laminated on the substrate 10 of the magnetoresistive effect element 1 (1a) and the second electrode layer 52 is connected to the cap layer 40 of the magnetoresistive effect element 1 (1a). The magnetoresistance device further includes a power source 53 and a voltmeter 54. The power source 53 and the voltmeter 54 are both connected to the first electrode layer 51 and the second electrode layer 52. Current is supplied from the power source 53 to the magnetoresistive effect element 1 (1a) along the stacking direction, and the voltage applied to the magnetoresistive effect element 1 (1*a*) at the time can be monitored with the voltmeter 54. Changes in the resistance of the magnetoresistive effect element 1 (1*a*) can be measured by monitoring the voltage applied to the magnetoresistive effect element 1 (1*a*) with the voltmeter 54 while sweeping the magnetic field from an external of device to the magnetoresistive effect element 1 (1*a*) in the state where a constant current is applied to the magnetoresistive effect element 1 (1*a*) in the stacking direction. And, the MR ratio of the magnetoresistive effect element 1 (1*a*) can be calculated from the results of measurement of changes in this resistance. The MR ratios of Examples 1-36 and Comparative Example 1 prepared as described below were measured by this magnetoresistance device 50.

Example 1

A magnetoresistive effect element of Example 1 was prepared as follows. A magnetoresistive effect element corresponding to the magnetoresistive effect element 1 of the above embodiment was prepared using $Al_{0.6}Zn_{0.4}$ as a material composed of Al alloy for the nonmagnetic spacer layer 33 and using Fe as a material for the first ferromagnetic layer 31 and the second ferromagnetic layer 32. A thickness of nonmagnetic spacer layer 33 was set to 5 nm. A thickness of the first ferromagnetic layer 31 was set to 3 nm and a thickness of the second ferromagnetic layer 32 was set to 3 nm. A MgO single crystal was used for the substrate, and Ag with 100 nm used for the underlayer. Also, Cr was used for the crystal orientation layer 15, and a thickness was set to 20 nm. IrMn was used for the antiferromagnetic layer 34, and a thickness was set to 10 nm. Ru was used for cap layer 40, and a thickness was set to 5 nm. Each layer on the substrate was produced by a sputtering method. After the formation of the magnetoresistive effect element, an annealing process in a magnetic field was performed, and uniaxial magnetic anisotropy was imparted to the first ferromagnetic layer and the second ferromagnetic layer. The heat treatment temperature in the heat treatment in the magnetic field was set to 300 degrees Celsius, and the intensity of the applied magnetic field was set to 5 kOe.

Examples 2 to 26

As shown in Table 5, after having changed the materials of nonmagnetic spacer layer 33, first ferromagnetic layer 31 and second ferromagnetic layer 32 from Example 1, and manufacture like Example 1 was estimated, and, by a procedure, the manufacture of the magnetoresistive effect element and the MR ratio were estimated. The same materials were used for the first ferromagnetic layer and the second ferromagnetic layer.

Examples 27 to 36

A magnetoresistive effect element of Examples 27 to 36 was prepared as follows. The nonmagnetic spacer layer 33 was constituted nonmagnetic metal layer 35 comprising the Al and the nonmagnetic insertion layer 36 and nonmagnetic insertion layer 37 comprising $Al_{0.98}Pt_{0.02}$. Also, thickness (t1) of the first nonmagnetic insertion layer 36 and thickness (t2) of the second nonmagnetic insertion layer 37 were done if the same, and it was changed from 0.1 nm to 15 nm, and it was manufactured. A magnetoresistive effect element corresponding to the magnetoresistive effect element 1*a* of the above embodiment was prepared using $Co_2Mn_{1.3}Si_{0.95}$ as a material for the first ferromagnetic layer and the second ferromagnetic layer. A thickness of nonmagnetic metal layer 35 was set to 5 nm. A thickness of the first ferromagnetic layer 31 was set to 3 nm and a thickness of the second ferromagnetic layer 32 was set to 3 nm. A MgO single crystal was used for the substrate, and Ag with 100 nm used for the underlayer. Also, Cr was used for the crystal orientation layer 15, and a thickness was set to 20 nm. IrMn was used for the antiferromagnetic layer 34, and a thickness was set to 10 nm. Ru was used for cap layer 40, and a thickness was set to 5 nm. Each layer on the substrate was produced by a sputtering method. After the formation of the magnetoresistive effect element, an annealing process in a magnetic field was performed, and uniaxial magnetic anisotropy was imparted to the first ferromagnetic layer and the second ferromagnetic layer. The heat treatment temperature in the heat treatment in the magnetic field was set to 300 degrees Celsius, and the intensity of the applied magnetic field was set to 5 kOe.

Comparative Example 1

As shown in Table 5 and 6 preparation of a magnetoresistive effect element and estimation of an MR ratio were performed according to the same preparation and estimation procedures as Example 1 except that Al was used as a material for the nonmagnetic spacer layer and Fe was used as a material for the first ferromagnetic layer 31 and the second ferromagnetic layer 32.

TABLE 5

| | NSL[1] NML[2] | FFL[3] SFL[4] | α | β | α + β | Normalized MR value |
|---|---|---|---|---|---|---|
| Ex.[5] 1 | $Al_{0.6}Zn_{0.4}$ | Fe | — | — | — | 1.4 |
| Ex. 2 | $Al_{0.95}Zn_{0.05}$ | Fe | — | — | — | 2.1 |
| Ex. 3 | $Al_{0.95}Zn_{0.05}$ | $Co_2Mn_\alpha Si_\beta$ | 1 | 1 | 2 | 8.8 |
| Ex. 4 | $Al_{0.9}Ru_{0.1}$ | $Co_2Mn_\alpha Si_\beta$ | 1 | 1 | 2 | 10.7 |
| Ex. 5 | $Al_{0.98}Pt_{0.02}$ | $Co_2Mn_\alpha Si_\beta$ | 1 | 1 | 2 | 12.9 |
| Ex. 6 | $Al_{0.98}Pt_{0.02}$ | $Co_2Mn_\alpha Si_\beta$ | 0.4 | 0.95 | 1.35 | 5.3 |
| Ex. 7 | $Al_{0.98}Pt_{0.02}$ | $Co_2Mn_\alpha Si_\beta$ | 0.6 | 0.95 | 1.55 | 5.7 |
| Ex. 8 | $Al_{0.98}Pt_{0.02}$ | $Co_2Mn_\alpha Si_\beta$ | 0.8 | 0.95 | 1.75 | 12.4 |
| Ex. 9 | $Al_{0.98}Pt_{0.02}$ | $Co_2Mn_\alpha Si_\beta$ | 1 | 0.95 | 1.95 | 13 |
| Ex. 10 | $Al_{0.98}Pt_{0.02}$ | $Co_2Mn_\alpha Si_\beta$ | 1.1 | 0.95 | 2.05 | 18 |
| Ex. 11 | $Al_{0.98}Pt_{0.02}$ | $Co_2Mn_\alpha Si_\beta$ | 1.2 | 0.95 | 2.15 | 20.3 |
| Ex. 12 | $Al_{0.98}Pt_{0.02}$ | $Co_2Mn_\alpha Si_\beta$ | 1.3 | 0.95 | 2.25 | 22.4 |
| Ex. 13 | $Al_{0.98}Pt_{0.02}$ | $Co_2Mn_\alpha Si_\beta$ | 1.4 | 0.95 | 2.35 | 19.2 |
| Ex. 14 | $Al_{0.98}Pt_{0.02}$ | $Co_2Mn_\alpha Si_\beta$ | 1.5 | 0.95 | 2.45 | 17 |
| Ex. 15 | $Al_{0.98}Pt_{0.02}$ | $Co_2Mn_\alpha Si_\beta$ | 1.6 | 0.95 | 2.55 | 8 |
| Ex. 16 | $Al_{0.98}Pt_{0.02}$ | $Co_2Mn_\alpha Si_\beta$ | 1.7 | 0.95 | 2.65 | 3.5 |
| Ex. 17 | $Al_{0.98}Pt_{0.02}$ | $Co_2Mn_\alpha Si_\beta$ | 1.3 | 0.55 | 1.85 | 5.7 |
| Ex. 18 | $Al_{0.98}Pt_{0.02}$ | $Co_2Mn_\alpha Si_\beta$ | 1.3 | 0.65 | 1.95 | 7.9 |
| Ex. | $Al_{0.98}Pt_{0.02}$ | $Co_2Mn_\alpha Si_\beta$ | 1.3 | 0.75 | 2.05 | 16.8 |

TABLE 5-continued

| | NSL[1] NML[2] | FFL[3] SFL[4] | $\alpha$ | $\beta$ | $\alpha + \beta$ | Normalized MR value |
|---|---|---|---|---|---|---|
| Ex. 19 | | | | | | |
| Ex. 20 | $Al_{0.98}Pt_{0.02}$ | $Co_2Mn_\alpha Si_\beta$ | 1.3 | 0.85 | 2.15 | 19.1 |
| Ex. 21 | $Al_{0.98}Pt_{0.02}$ | $Co_2Mn_\alpha Si_\beta$ | 1.3 | 0.95 | 2.25 | 22.3 |
| Ex. 22 | $Al_{0.98}Pt_{0.02}$ | $Co_2Mn_\alpha Si_\beta$ | 1.3 | 1.05 | 2.35 | 22 |
| Ex. 23 | $Al_{0.98}Pt_{0.02}$ | $Co_2Mn_\alpha Si_\beta$ | 1.3 | 1.15 | 2.45 | 22.1 |
| Ex. 24 | $Al_{0.98}Pt_{0.02}$ | $Co_2Mn_\alpha Si_\beta$ | 1.3 | 1.25 | 2.55 | 20.5 |
| Ex. 25 | $Al_{0.98}Pt_{0.02}$ | $Co_2Mn_\alpha Si_\beta$ | 1.3 | 1.35 | 2.65 | 9 |
| Ex. 26 | $Al_{0.98}Pt_{0.02}$ | $Co_2Mn_\alpha Si_\beta$ | 1.3 | 1.45 | 2.75 | 3.2 |
| CE[6] 1 | Al | Fe | — | — | — | 1 |

[1]Nonmagnetic spacer layer
[2]Nonmagnetic metal layer
[3]First ferromagnetic layer
[4]Second ferromagnetic layer
[5]Example
[6]Comparative Example

TABLE 6

| | NSL[1] NML[2] | FNIL[3] SNIL[4] | t1 t2 (nm) | FFL[5] SFL[6] | Normalized MR value |
|---|---|---|---|---|---|
| Ex.[7] 27 | Al | $Al_{0.98}Pt_{0.02}$ | 0.1 | $Co_2Mn_{1.3}Si_{0.95}$ | 22.4 |
| Ex. 28 | Al | $Al_{0.98}Pt_{0.02}$ | 0.2 | $Co_2Mn_{1.3}Si_{0.95}$ | 22.8 |
| Ex. 29 | Al | $Al_{0.98}Pt_{0.02}$ | 0.5 | $Co_2Mn_{1.3}Si_{0.95}$ | 27.5 |
| Ex. 30 | Al | $Al_{0.98}Pt_{0.02}$ | 1 | $Co_2Mn_{1.3}Si_{0.95}$ | 27.9 |
| Ex. 31 | Al | $Al_{0.98}Pt_{0.02}$ | 2 | $Co_2Mn_{1.3}Si_{0.95}$ | 27.4 |
| Ex. 32 | Al | $Al_{0.98}Pt_{0.02}$ | 5 | $Co_2Mn_{1.3}Si_{0.95}$ | 27 |
| Ex. 33 | Al | $Al_{0.98}Pt_{0.02}$ | 8 | $Co_2Mn_{1.3}Si_{0.95}$ | 25.1 |
| Ex. 34 | Al | $Al_{0.98}Pt_{0.02}$ | 10 | $Co_2Mn_{1.3}Si_{0.95}$ | 14.5 |
| Ex. 35 | Al | $Al_{0.98}Pt_{0.02}$ | 12 | $Co_2Mn_{1.3}Si_{0.95}$ | 4.2 |
| Ex. 36 | Al | $Al_{0.98}Pt_{0.02}$ | 15 | $Co_2Mn_{1.3}Si_{0.95}$ | 1.1 |
| CE[8] 1 | Al | — | — | Fe | 1 |

Figure 4:
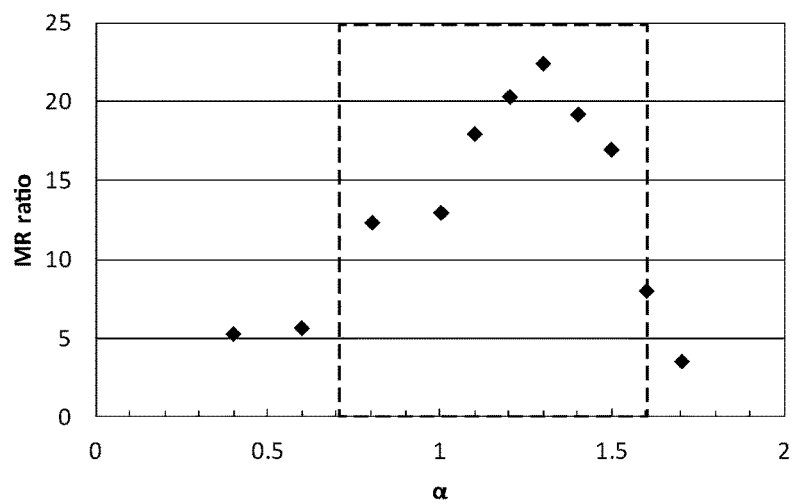
FIG. 4 (a) is a diagram illustrating a relationship between $\alpha$ and $\alpha$ normalized MR ratio.
Figure 4:
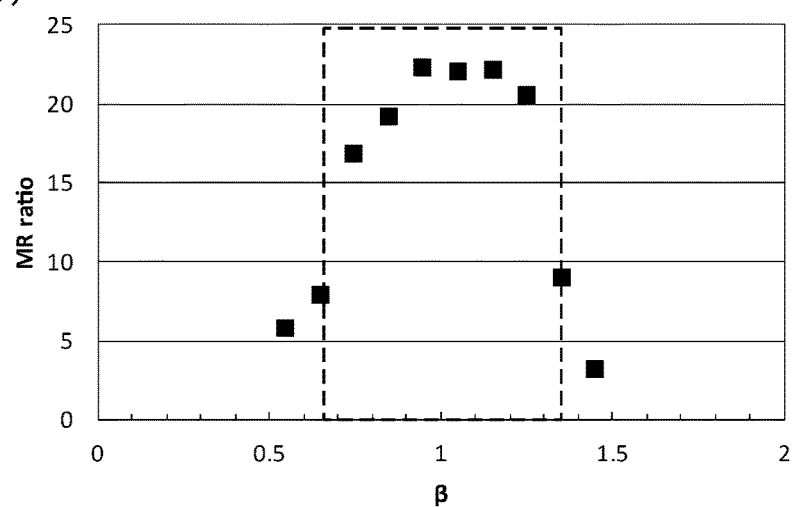
Figure 4:
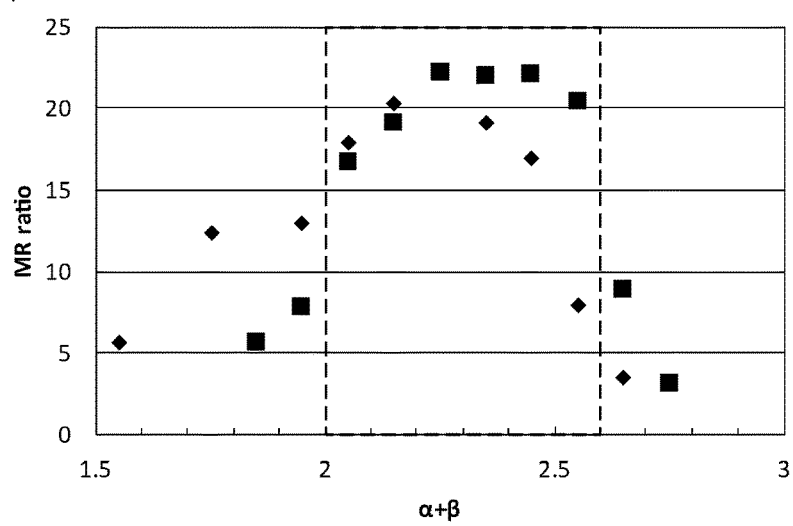

[1]Nonmagnetic spacer layer
[2]Nonmagnetic metal layer
[3]First nonmagnetic insertion layer
[4]Second nonmagnetic insertion layer
[5]First ferromagnetic layer
[6]Second ferromagnetic layer
[7]Example
[8]Comparative Example Part (a) of FIG. 4 is a diagram illustrating a relationship between $\alpha$ and $\alpha$ normalized MR ratio in Example 6 to Example 16. In Example 6 to Example 16 $\beta$ was fixed to 0.95, and a was changed between 0.4 and 1.7. In (a) part of FIG. 4 the normalized MR ratios when $0.7<\alpha<1.6$ is surrounded by a broken line.

Part (b) of FIG. 4 is a diagram illustrating a relationship between $\beta$ and $\alpha$ normalized MR ratio in Example 17 to Example 26. In Example 17 to Example 26, a was fixed to 1.3, and 3 was changed between 0.55 and 1.45. In (b) part of FIG. 4 the normalized MR ratios when $0.65<\beta<1.35$ are surrounded by a broken line.

Part (c) of FIG. 4 is a diagram illustrating a relationship between $\alpha+\beta$ and a normalized MR ratio in Examples 6 to 16 and Examples 17 to 26. In Example 6 to Example 16, $\alpha+\beta$ was changed between 1.35 and 2.65. In Example 17 to Example 26, $\alpha+\beta$ was changed between 1.85 and 2.75. In (c) part of FIG. 4 the normalized MR ratios when $2<\alpha+\beta<2.6$ are surrounded by a broken line.

As illustrated in (a) part to (c) part of FIG. 4, the magnetoresistive effect elements according to all the examples had larger normalized MR ratios than those according to the comparative examples.

Also, as illustrated in part (a) and part (b) of FIG. 4, when $0.7<\alpha<1.6$ and $0.65<\beta<1.35$, the magnetoresistive effect elements according to the examples had larger normalized MR ratios. To be specific, the normalized MR ratios of the magnetoresistive effect element according to the examples exceeded 10. This indicates that the Heusler alloy for the first ferromagnetic layer 31 and the second ferromagnetic layer 32 has a lattice constant close to that in a stoichiometric composition when $0.7<\alpha<1.6$ and $0.65<\beta<1.35$, and that the lattice mismatch between the Heusler alloy and the Al alloy ($Al_\gamma X_{1-\gamma}$ where $0.75<\gamma<1$) comprised by the nonmagnetic spacer layer 33 is especially reduced. The magnetoresistive effect element of this case includes the first ferromagnetic layer 31, the nonmagnetic spacer layer 33 and the second ferromagnetic layer 32 has good qualities, and exhibits a large magnetoresistive effect.

Also, as illustrated in part (c) of FIG. 4, when $2<\alpha+\beta<2.6$, the magnetoresistive effect elements according to the examples can have a normalized MR ratios exceeding 10. This large normalized MR ratio is based on the result that a Heusler alloy is likely to have half-metal characteristics when $2<\alpha+\beta<2.6$, and a Heusler alloy having half-metal characteristics shows a large magnetoresistive effect.

Figure 5:
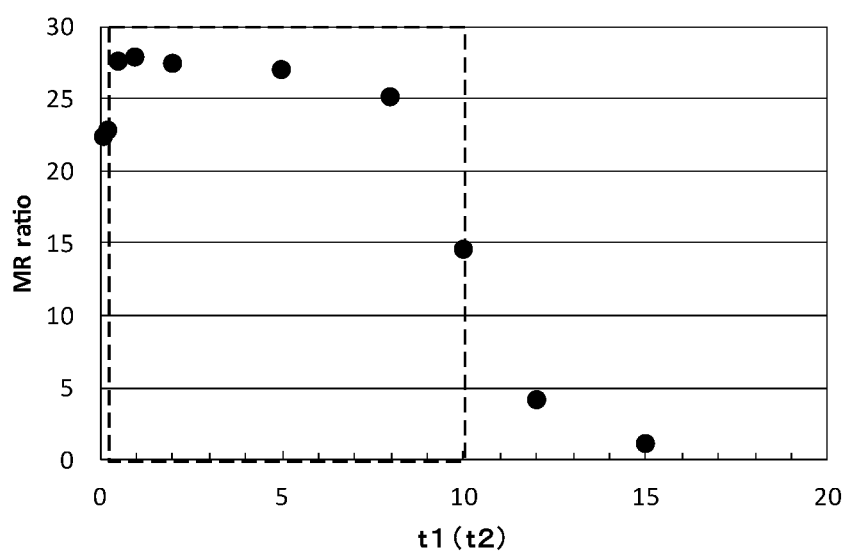
FIG. 5 is a diagram illustrating a relationship between a thickness t1 of a first nonmagnetic insertion layer or a thickness t2 of a second nonmagnetic insertion layer and the normalized MR ratio in Examples.

FIG. 5 is a figure which shows the relations with thicknesses t1 of the first nonmagnetic insertion layer 36 or thicknesses t2 of the second nonmagnetic insertion layer 37 and a normalized MR ratio in Example 27 to Example 36. In Example 27 to Example 36, t1 and t2 were equal to each other, and t1 (t2) was changed between 0.1 nm and 15 nm. In FIG. 5, the normalized MR ratios when 0.2 nm<t1 (t2)<10 nm are surrounded by a broken line.

As shown in FIG. 5, the magnetoresistive effect elements 1a according to the examples can have a normalized MR ratios exceeding 25 when 0.2 nm<t1 (t2)<10 nm. This large normalized MR ratio is based on the result that the lattice mismatch between the nonmagnetic spacer layer 33 and the first ferromagnetic layer 31 and/or the second ferromagnetic layer 32 is reduced, and the spin scattering is reduced in the electrons moving from the first ferromagnetic layer 31 to the second ferromagnetic layer 32.

While the present invention has been described with reference to the embodiment and the examples, the present invention is not limited to the embodiment and the examples, and can be variously modified. For example, the magnetoresistive effect element 1 (1a) of the embodiments above can have a current in plane (CIP) structure in which a detection current flows along the stacking surface direction, instead of a CPP structure.

INDUSTRIAL APPLICABILITY

According to the present embodiment, a magnetoresistive effect element having a large magnetoresistive effect is provided. Also, with a magnetoresistive effect element satisfying the present embodiment, it is possible to achieve a high MR ratio. With a magnetic head, a sensor, a high-frequency filter, or an oscillator including the above-mentioned magnetoresistive effect element, an excellent magnetoresistive effect is provided. Accordingly, they can exhibit excellent characteristics based thereon.

DENOTATION OF REFERENCE NUMERALS

1,(1*a*): Magnetoresistive effect element
10: Substrate layer
20: Underlayer
30: Magnetoresistive layer
31: First ferromagnetic layer
32: Second ferromagnetic layer
33: Nonmagnetic spacer layer
34: Antiferromagnetic layer
35: Nonmagnetic metal layer
36: First nonmagnetic insertion layer
37: Second nonmagnetic insertion layer
40: Cap layer

What is claimed is:

1. A magnetoresistive effect element comprising:
a first ferromagnetic layer as a magnetization fixed layer;
a second ferromagnetic layer as a magnetization free layer; and
a nonmagnetic spacer layer provided between the first ferromagnetic layer and the second ferromagnetic layer,
wherein the nonmagnetic spacer layer comprises an Al alloy represented by General Formula (1), and thereby lattice mismatch between the nonmagnetic spacer layer, and the first ferromagnetic layer and/or the second ferromagnetic layer is reduced, compared to lattice mismatch when the nonmagnetic spacer layer is formed of Al, $$Al_\gamma X_{1-\gamma} \quad (1)$$

wherein, X indicates one element selected from the group consisting of Li, N, Mg, Si, Sc, Cr, Fe, Ni, Cu, Zn, Ga, Ge, Zr, Ru, Pd, Ag, Sn, W, Pt, Au and Th, and $\gamma$ is $0.5<\gamma<1$.

2. The magnetoresistive effect element according to claim 1, wherein the nonmagnetic spacer layer having at least one of a nonmagnetic metal layer formed of Al, a first nonmagnetic insertion layer provided on a lower surface of the nonmagnetic metal layer, and a second nonmagnetic insertion layer provided on an upper surface of the nonmagnetic metal layer, the first nonmagnetic insertion layer and the second nonmagnetic insertion layer comprising an Al alloy represented by General Formula (1).

3. The magnetoresistive effect element according to claim 2, wherein: when a thickness of the first nonmagnetic insertion layer is defined as t1, t1 satisfies 0.2 nm<t1<10 nm; and when a thickness of the second nonmagnetic insertion layer is defined as t2, t2 satisfies 0.2 nm<t2<10 nm.

4. The magnetoresistive effect element according to claim 1, wherein it is $0.75<\gamma<1$ in general formula (1).

5. The magnetoresistive effect element according to claim 1, wherein at least one of the first ferromagnetic layer and the second ferromagnetic layer comprises a Heusler alloy represented by General formula (2), $$Co_2L_\alpha M_\beta \quad (2)$$

where L is at least one or more elements of Mn, Fe and Cr, M indicates one or more elements selected from the group consisting of Si, Al, Ga, and Ge, $0.7<\alpha<1.6$, and $0.65<\beta<1.35$.

6. The magnetoresistive effect element according to claim 5, wherein, in General Formula (2), $2<\alpha+\beta<2.6$.

7. The magnetoresistive effect element according to claim 1, wherein, in general formula (1), X is one element selected from a group comprising the W, Pt, Au and Th.

8. The magnetoresistive effect element of claim 1, wherein a crystal structure of the Al alloy represented by general formula (1) has a face centered cubic lattice structure.

9. The magnetoresistive effect element according to claim 1, wherein, in General Formula (1), X is one element selected from Zr, Ru, Pd, Ag, Sn, W, Pt, Au and Th.

* * * * *